Dec. 20, 1966 T. S. INSTON, JR., ET AL 3,293,499

CHASSIS FOR MOUNTING ELECTRICAL COMPONENTS

Filed Feb. 25, 1963

INVENTORS:
Thomas S. Inston, Jr.
N. William Gradwohl
Guenther G. Prehn
By Smyth, Roston & Pavitt
Attorneys 3,293,499

CHASSIS FOR MOUNTING ELECTRICAL COMPONENTS

Thomas S. Inston, Jr., and Norman William Gradwohl, Canoga Park, and Guenther G. Prehn, Simi, Calif., assignors to Advanced Communications, Inc., Chatsworth, Calif., a corporation of California Filed Feb. 25, 1963, Ser. No. 260,655
1 Claim. (Cl. 317—101)

The present invention relates to electronic equipment and, more particularly, to new and improved means for packaging electronic components to form small, compact assemblies.

At the present time, most electronic assemblies consist of a large number of components such as transistors or vacuum tubes, transformers, condensers, resistors, etc., that are electrically interconnected with each other. These components are normally rigidly mounted on a chassis that acts as a structural support for physically retaining the components in predetermined assembled relationships. When such an assembly is to be employed in an environment where it will be subjected to large impact, vibration and/or shock loadings, it has been necessary to provide special resilient mountings or supports for the chassis in an effort to isolate the chassis and the components from these loads. However, even when employing such mountings and supports, such loads very frequently occur in the components and affect their characteristics.

In addition, at least a portion of the components in the assembly may radiate magnetic and/or electric fields that tend to react with one or more of the surrounding components on the chassis or even with adjacent structure and/or components on such structures. These fields are also frequently effective to create electric currents that circulate through various portions of the chassis and surrounding structures and thereby react with one or more of the components. As a result of these and other effects, in multistage electronic assemblies, it is not uncommon for interstage coupling to occur whereby the signals in one stage may be coupled into another stage and produce instability in the stages and in the assembly. As the frequency at which the assembly operates increases, and as the spacing between the components decreases, the problem of instability becomes more acute.

To reduce or eliminate these undesirable effects, it has been customary to employ special shields around the components and/or to physically separate the components as far as possible from each other. Such techniques have been reasonably effective in preventing interstage coupling and in improving the stability of the assembly, particularly at lower frequencies. However, this has the undesirable effect of producing assemblies having large portions of their weight and/or volume devoted to shielding and spacing the components so as to isolate the stages from each other. Moreover, very frequently, it is extremely difficult if not impossible to completely shield one or more of the components in an assembly so that it will be completely isolated from adjacent components and/or from the environment surrounding the assembly. When the components are not effectively isolated from the environment around the assembly, the characteristics of the assembly may vary over an excessively large range depending upon whether or not the assembly is installed in a surrounding structure. As a consequence, the final adjustments of the assembly must be deferred until after the assembly has been operatively mounted in the surrounding structure. When the assembly has been mounted in this manner, it may be inaccessible and therefore extremely difficult to adjust.

It is now proposed to provide means for packaging the components in electronic assemblies which will overcome the foregoing difficulties. More particularly, it is proposed to provide means that will not only make the manufacture of electronic assemblies simpler and cheaper, but will also permit the manufacture of assemblies that are compact in size and light in weight. It is also proposed to provide means that will effectively shield the various components in an electronic assembly from each other and from the surrounding structure. It is further proposed to provide means that will permit the manufacture of electronic assemblies that are very rugged and have the components mounted therein so as to be capable of withstanding large amounts of impact, shocks and vibrations. This is to be accomplished by providing chassis means such that the components may be mounted in and on the chassis means so as to be isolated from vibratile and shock loads and to be effectively isolated from each other and from any surrounding structures such that there can be no interstage coupling to provide variations or instability in the assembly. More particularly, in the single embodiment of the invention described herein, a chassis member of electrically conductive material is provided which has various portions thereof arranged to form a plurality of mounting spaces that are defined by one or more electrically conductive surfaces. The various components may then be mounted in these spaces so as to be inherently shielded by the various portions of the chassis.

For example, the chassis includes a central web portion having openings extending at least partially therethrough to form pockets having electrically conductive surfaces. An electrical component may be mounted in each of these pockets by means of a resilient bushing that will be effective to mechanically isolate the component from vibrations and shocks. In addition, the component may be oriented so that any fields produced by the component will be directed into and absorbed by the electrically conductive surface surrounding the component. At the same time, any stray fields present in the vicinity of the components will be absorbed and grounded by the chassis and prevented from reaching the component. As a result of being encased in the central web portion, the various fields will be prevented from being coupled into or out of the components or into or out of any surrounding structures. In addition, the chassis may include one or more means such as a flange on at least one side to form electrically conductive external surfaces that are angularly disposed with respect to the central web portion to form additional mounting spaces. Additional components may then be mounted in these spaces so as to be shielded by the conductive surfaces. Thus, the various stages will be effectively isolated from each other and the entire assembly will be effectively isolated from all surrounding structures. As a consequence, the assembly will be very stable and sufficiently independent of any surrounding structures to even permit it to be pre-tuned prior to its installation in a more comprehensive assembly.

These and other features and advantages of the present invention will become readily apparent from reading the following detailed description of one embodiment of the invention, particularly when taken in connection with the accompanying drawings wherein like reference numerals refer to like parts, and wherein.

Figure 1:
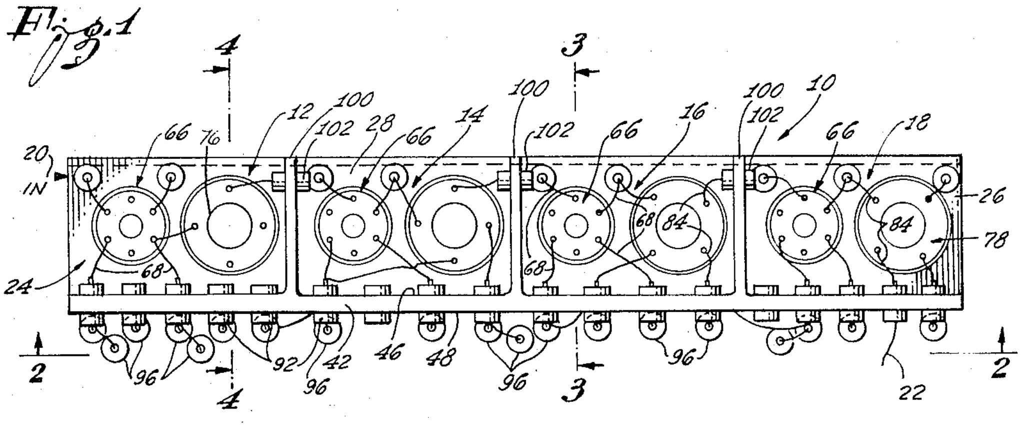
FIGURE 1 is a plan view of an electronic assembly embodying one form of the present invention.
Figure 2:
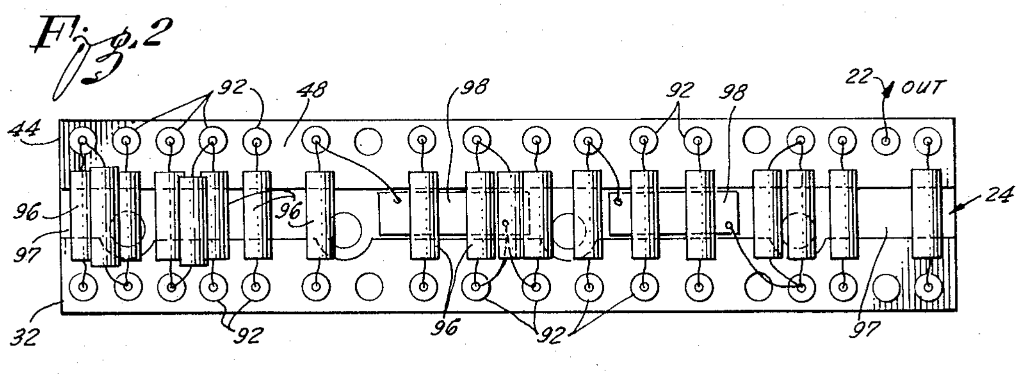
FIGURE 2 is a side view of the electronic assembly of FIGURE 1.

Referring to the drawings in more detail, the present invention is particularly adapted to be embodied in an electronic assembly 10 consisting of a plurality of successive stages 12, 14, 16 and 18 which may include various components such as transistors, condensers, resistors, etc. that are interconnected with each other to perform some particular function. This assembly 10 may be a completely self-contained unit or it may form a sub-assembly that is to be installed in a more comprehensive assembly so as to form only a part thereof. By way of example, the assembly 10 may form an intermediate frequency amplifier that is to be employed in a more comprehensive assembly such as a radio receiver. More particularly, the assembly 10 may include at least one stage for amplifying a radio frequency signal, a mixer stage that includes a local oscillator and one or more stages that are pre-tuned to a fixed intermediate frequency for amplifying signals of that frequency. It may thus be seen that the input 20 may be connected to a source of radio frequency signal that it is desired to receive. This signal will then be fed through the successive stages where it will be heterodyned with a signal from the local oscillator to form a signal of a predetermined and fixed intermediate frequency. Each of the succeeding stages may be tuned to this intermediate frequency so that the signal will then be further amplified and discharged from the output 22.

The various components such as the transistors, inductances, condensers, resistors, etc. that are incorporated into the various stages may be mounted on a rigid chassis 24. This chassis 24 performs several functions including that of being a structural member for supporting the various components in predetermined fixed relations. Although the chassis 24 may be made of any suitable material, it preferably consists of an electrically conductive material. If it is desirable to reduce the overall weight of the assembly 10, the chassis 24 may be made of a lightweight material such as aluminum or magnesium.

Figure 3:
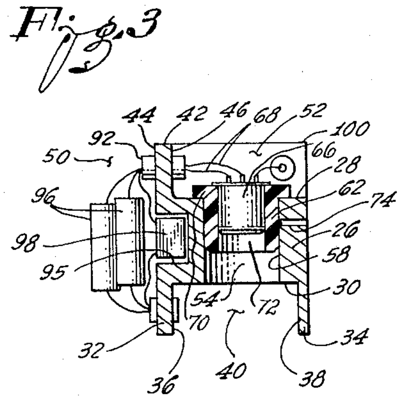
FIGURE 3 is a cross-sectional view of the electronic assembly taken substantially along the plane of line 3—3 of FIGURE 1 and looking in the direction of the arrows thereon.
Figure 4:
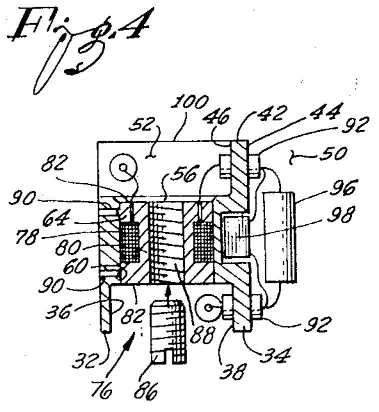
FIGURE 4 is a cross-sectional view similar to FIGURE 3 but taken substantially along the plane of line 4—4 of FIGURE 1 and looking in the direction of the arrows thereon.

The present chassis 24 may comprise a single elongated member that may be fabricated by any suitable means such as casting, extruding, or machining out of a solid bar, etc. This member may include a centered web or mounting portion 26 that is of a substantially uniform thickness and extends the entire length of the chassis 24. Since this portion 26 consists of an electrical conductive material, the tops and bottoms thereof (as seen in FIGURES 3 and 4) will form an electrically conductive upper surface 28 and an electrically conductive lower surface 30.

A pair of flanges 32 and 34 may be provided which extend along the opposite edges of the web 26 and project downwardly therefrom. These flanges 32 and 34 which may extend the entire length of the web 26 are of substantially identical heights and thickness. These flanges 32 and 34 may consist of the same electrically conductive material as the mounting portion or web 26 so that the inner surfaces 36 and 38 thereof will be electrically conductive. These surfaces 36 and 38 and the bottom surface 30 of the center web 26 will thereby form a space 40 on the lower side of the chassis 24 that is bounded by the three electrically conductive surfaces. This space 40 will thus be separated from any other spaces around the chassis 24 by at least one electrically conductive surface.

One or more additional flanges 42 may be provided along at least one of the edges of the web 26 so as to extend the entire length thereof. This flange 42 may be disposed on the same edge as the flange 32 but projects in the opposite direction therefrom. This flange 42 may also be constructed of the same electrically conductive material as the web 26 so that the sides of the flange 42 will form a pair of electrically conductive surfaces 44 and 46. The surface 44 may be substantially coplanar with the exterior surface on the flange 32. As a result, the exteriors of the two flanges 32 and 44 will form a surface 48 that extends longitudinally for the entire length of one side of the chassis 24, and vertically for the full height of the chassis. A second mounting space 50 will thus be formed immediately adjacent to the surface 48. Since this surface 48 is electrically conductive, the second mounting space 50 will be separated from the remaining spaces around the chassis by at least one electrically conductive surface.

The surface 46 formed by the inner side of the flange 42 is substantially normal to the upper surface 28 of the web 26. These two surfaces 28 and 46 will thus at least partially define a third mounting space 52 immediately above the central web 26. This mounting space 52 is similar to the mounting space 40 below the web 26. Since the surfaces 28 and 46 are electrically conductive, this space 52 will be separated from the remaining spaces 40 and 50 by at least one electrically conductive surface.

It may thus be seen that there will be at least three spaces 40, 50 and 52 immediately adjacent to the chassis 24 and each of these spaces will be bounded by one or more of the various electrically conductive surfaces 28, 30, 36, 38, 46 and 48. As a consequence, any magnetic fields and/or electrical fields that are present in any of these spaces 40, 50 or 52 will be incident upon one or more of the surfaces. In the event these fields are of an alternating nature when they are incident upon one of the electrically conductive surfaces they will tend to create local currents in the surface so as to be absorbed thereby. Thus, each of the mounting spaces 40, 50 and 52 will be effectively isolated from each other.

In addition to the foregoing mounting spaces 40, 50 and 52, further mounting spaces may be provided that are especially effective to shielding the components such as transistors and inductances, etc. that are the most apt to radiate electric and/or magnetic fields or are most sensitive to being affected by such fields. Each of these mounting spaces may be formed by a pocket 54 or 56 that extends inwardly into the central web 26 and at least partially therethrough. Each of these pockets may be formed in the center web 26 by any suitable means. For example, if the chassis 24 is cast, these pockets may be cast into the chassis. In the present instance, the pockets are formed by a machining operation such as drilling a passage completely through the web 26. Each of the pockets 54 and 56 will thus form an empty space that is surrounded by a substantially cylindrical surface 58 or 60. If the web comprises an electrically conductive material such as aluminum or magnesium, these cylindrical surfaces will also be electrically conductive. It may thus be seen that if magnetic and/or electric fields are generated inside of a pocket, the fields will be incident upon the surface and very little, if any, of the fields will be radiated out of the pocket. Conversely, if there are one or more fields present in one or more of the mounting spaces 40, 50 and 52 around the chassis 24, little if any of the fields will be able to enter into the pockets.

Although the various components may be secured within these pockets by any suitable means, in the present instance, a separate support member 62 or 64 is provided for each pocket. Each of these members may have a substantially cylindrical exterior portion that is complementary to the interior surface 58 or 60 of a pocket 54 or 56 so as to be maintained in frictional engagement therewith and a portion for supporting one of the components thereon.

More particularly, if it is desired to mount a component such as a transistor 66 in one of the pockets 54, the supporting member 62 may comprise a cylindrical bushing similar to that illustrated in FIGURE 3. Although the transistor 66 may be of any suitable design, in the present instance, it includes an outer protective housing comprising a generally cup-shaped, metallic member having a closed lower end and a substantially cylindrical exterior. The upper end of the housing may include a rim that may be crimped over a disc to thereby seal the interior of the housing. A plurality of electrical conductors 68 may extend through this disc with the inner ends being electrically connected to the electrodes disposed inside of the housing. The outer ends of these conductors may extend outwardly from the sealing disc to form leads 68 for being electrically interconnected with the related components.

The support member or bushing 62 for securing the transistor 66 in position in the pocket 54 has an exterior surface that is substantially cylindrical. The outside diameter of this surface is preferably slightly larger than the inside diameter of the surface 58 of the pocket. As a result, when the bushing 62 is disposed inside of a pocket 54, the material therein will be compressed radially inwardly. The upper end of the bushing may include a radially outwardly projecting shoulder 70 that fits against the surface 28 on the top of the web 26 when the bushing 62 is properly seated within the passage.

The interior of the bushing 62 may include a substantially cylindrical passage 72 that extends axially through the bushing from one end to the other end. The inside diameter of this passage 72 may be slightly smaller than the corresponding outside diameter of the transistor housing. As a consequence, if the transistor 66 is disposed within the passage, the housing will tend to stretch or expand the material in the bushing 62.

The bushing 62 may be fabricated out of any suitable material. However, it has been found desirable to employ a substance that is plastic and deformable. In addition, the material should also have a sufficient resilience for absorbing vibrations. It has been found that materials such as nylon and Teflon are particularly well suited for this purpose.

It may thus be seen that the transistor 66 may be forced into the passage 72 through the bushing 62 until the crimped rim fits against the top of the shoulder 70. Following this, the bushing 62 with the transistor 66 therein may be forced into the pocket 54 until the shoulder 70 fits against the surface 28 of the web 26. When the bushing 62 is thus forced into the pocket 54, the material in the bushing 62 will be compressed between the transistor 66 and the surface 58 of the pocket so as to be securely retained in position. In order to facilitate forcing the bushing and transistor into the pocket, one or more relief holes 74 may be drilled laterally through the chassis 24 so as to intersect the pocket 54. These holes 74 will permit some of the material in the bushing 62 to be extruded into the relief holes 74 and thereby relieve a portion of the compressive forces present in the material. This will reduce the force required to insert the bushing 62. Furthermore, at the conclusion of inserting operation and after the material has been extruded into the relief holes 72, it will be effective to assist in securely retaining the bushing 62 in position.

It will be readily apparent that once the transistor 66 is mounted on the bushing 62 and the bushing 62 is forced into a pocket 54, the transistor 66 will be surrounded by an electrically conductive surface 58. Any fields radiated from the transistor 66 will be absorbed by the conductive surface 58 of the pocket 54 and will not escape from the pocket and into one of the mounting spaces 40, 50 or 52. Conversely, fields originating in any of the mounting spaces 40, 50 or 52 will not be able to enter into the pocket 54. Thus, the transistor 66 will be very effectively isolated from any surrounding components, etc.

In the event it is desired to couple the various stages 12 to 18, inclusive, together by means of transformers having a plurality of inductive windings thereon, the transformers 76 may be mounted in one or more of the pockets 56. Although the transformers 76 may be of any desired form, in the present embodiment, each transformer has one or more inductive windings 78 that are wound upon a form such as a support member 64 particularly adapted to be mounted in one of the pockets 56. More particularly, the support member 64 may have a center portion 80 and a pair of enlarged flanges 82. The flanges 82 are disposed at the opposite ends of the center portion 80 so as to project radially outwardly therefrom. The outside diameter of the flanges 82 may be substantially equal to or slightly larger than the inside diameter of the pocket 56. As a consequence, when the form 64 is disposed inside of the pocket 56, the material in the flanges 82 will be compressed radially inwardly. The overall length of the support member 64 as defined by the opposite ends of the flanges 82 may be substantially equal to the length of the pocket 56. Thus, when the support member 64 is disposed in a pocket 56, the opposite ends thereof will be substantially flush with the surfaces on the opposite sides of the web 26.

The center portion 80 may be substantially cylindrical and have a diameter that is equal to the inside diameter of the windings 78. The space between the flanges 82 may be equal to the axial length of the windings 78. The electrical conductors that form the various windings 78 of the transformers 76 may be wound around the center portion 80 so as to substantially fill the space between the flanges 82. The exterior surface of these windings 78 may have an outside diameter that is slightly less than the outside diameter of the flanges 82. As a consequence, the windings 78 will not be disturbed when the transformer is inserted into a pocket 56. The ends of the various conductors forming the windings 78 may extend through one or both of the flanges and form leads 84 for interconnecting the windings 78 with the various components in the assembly 10. In the event it is desirable to be able to control or vary the inductance of one or more of the windings 78, a tuning slug 86 may be provided. In the present instance, the slug 86 is a member of a magnetic material such as a ferrite that fits into a passage 88 extending axially of the support member 64. The exterior of the slug 86 and the interior of the passage 88 may be threaded to facilitate moving the slug 86 axially into and out of the windings 78.

It may thus be seen that once the various coils 78 in the transformer 76 have been wound onto the support member 64, the member 64 may be forced axially into the pocket 56 until the ends of the flanges 82 are substantially flush with the surfaces 28 and 30. This support member 64 may be made of a plastically deformable material similar to that in the support members 62 for the transistors 66. Thus, although the outside diameters of the flanges 82 may be slightly greater than the inside diameter of the pocket 56, as the support member 64 is forced into the pocket at least the material in the flanges 82 will be compressed radially inwardly. In order to facilitate inserting the support member into the pocket, one or more relief holes 90 may be drilled laterally through the chassis 24 to intersect the pocket 56 to allow portions of the flange material to be extruded into the holes 90. This will relieve some of the compressive stresses in the flanges 82 and once the material has been extruded into the holes 90, it will tend to retain the support member 64 in position.

It may thus be seen that once the support member 64 has been forced into the pocket 56, the windings 78 will be disposed in the pocket 56 and surrounded by the cylindrical surface 60. Since this surface 60 is electrically conductive, any electric and/or magnetic fields that may be radiated from the windings 78 will be absorbed by the surface and prevented from escaping to the other mounting spaces 40, 50 or 52. Also, any fields in or around these mounting spaces will be precluded from entering the pocket so as to interfere with the windings.

It may thus be seen that if it is desired to fabricate a small, compact electronic assembly, the present chassis may be employed for supporting the various components. More particularly, in the event the assembly 10 includes a plurality of separate stages 12, 14, 16 and 18, the components for each of the stages may be disposed upon the chassis 24 in some particular location. This will cause all of the various components in each stage to be closely grouped together so that very short leads may be employed. Each of the stages may have a variable impedance device or an electronic valve such as a vacuum tube and a transistor. This component may be disposed in a bushing 62 and then inserted into its respective pocket 54.

In the event the stages are to be coupled together by means of a component such as a tuned transformer, the transformer 76 may be wound on a suitable supporting member 64 and then press-fitted into its respective pocket. Following this, the various electrical leads 68 and 84 from the transistors 66 and transformers 76, respectively, may be interconnected with the other components within that stage or with the components in succeeding stages. These components may include devices such as resistors, condensers, etc. These components may be mounted on the chassis so as to be disposed in the various mounting spaces 40, 50 or 52.

In order to facilitate mounting these components, it has been found desirable to provide a plurality of binding posts 92 that are secured to the web 26 and/or the various flanges 32, 34 and 42. A portion of these binding posts may be connected directly to the electrical conductive material forming the chassis 24 so as to form a ground connection. The remaining portions of the binding posts may extend completely through the chassis and be disposed in a dielectric sleeve so as to be insulated from the electrically conductive material.

More particularly, it has been found desirable to provide a row of binding posts along the edges of flanges 32 and 34 so as to project from the surface 48. A plurality of components such as resistors 96 may have their leads connected to these binding posts. These resistors 96 will thus be disposed in the mounting space 50 so as to extend along the exterior surface 48 in substantially vertical positions.

To facilitate mounting additional components in the space 50, a channel 95 may be cut into the surface 48 so as to extend the length of the chassis 24. Various components such as wafer condensers 98 may then be disposed in the channel 95 so as to be bounded on at least three sides by electrically conductive surfaces. The leads for these condensers 98 may then be connected to one or more of the binding posts 92.

It has been found desirable for all of the components which are mounted along the surface 48 so as to be disposed in mounting space 50 to carry D.C. biasing signals, etc. and be substantially free of any high frequency signals or else to form a bypass for such signals directly to ground for a grounded binding post. As a consequence, there will be little or no electric or magnetic field radiated from any of these components. As a consequence, in the event the chassis 24 is mounted such that the space 50 is near any surrounding structure, the structure will have little or no effect upon the characteristics of the overall assembly.

The remaining components which have substantial amounts of high frequency signals thereon may be disposed in the lower mounting space 40 or in the upper mounting space 52 so as to be connected directly to the other components such as the transistors 66 and inductances or transformers 76.

Although the foregoing structure will provide adequate isolation, in the event it is desired to provide further isolation and particularly between the successive stages 12 to 18, inclusive, one or more metallic partitions 100 may be disposed between the web 26 and one or more of the flanges such as 42. These partitions 100 extend transversely of the chassis 24. These partitions are substantially the same height as the flange 42 and form a plurality of conductive surfaces which will divide the mounting space 52 into separate and isolated compartments for each of the stages. To permit the interconnecting of components in the stages, one or more binding posts 102 may extend through the partitions 100.

While only a single embodiment of the invention has been shown and described herein, it will be readily apparent to persons skilled in the art that numerous changes and modifications may be made thereto without departing from the spirit and scope of the invention. Accordingly, the present disclosure and the description thereof is for illustrative purposes only and do not limit the invention which is defined only by the claim which follows.

What is claimed is:

A chassis for supporting a plurality of electrical components in an interconnected electrical relationship, said chassis including:

a central mounting bar of electrically conductive magnetically shielding material and having a pair of oppositely oriented sides, so that the bar has a predetermined thickness, a plurality of pockets disposed in said bar and extending inwardly from one of said sides to form an electrically conductive surface, each of said pockets forming first mounting spaces large enough to receive one of said components and at least partially surrounding a component disposed therein, a pair of electrically conductive flanges extending from said mounting bar and projecting in opposite directions from said sides, said flanges forming a common external surface that is substantially normal to said sides, and means for mounting additional ones of said components on said flanges adjacent said external surface so as to be separated from said first components by said electrically conductive surfaces of said flanges.

References Cited by the Examiner

UNITED STATES PATENTS

| | | | |
|---|---|---|---|
| 2,499,589 | 3/1950 | Kennedy | 174—35 |
| 2,512,138 | 6/1950 | Butt | 317—101 |
| 2,945,163 | 7/1960 | Kilby | 317—101 |

FOREIGN PATENTS

| | | |
|---|---|---|
| 1,053,050 | 3/1959 | Germany. |
| 785,971 | 11/1957 | Great Britain. |

ROBERT K. SCHAEFER, *Primary Examiner.*

KATHLEEN H. CLAFFY, *Examiner.*

H. J. RICHMAN, W. C. GARVERT, *Assistant Examiners.*